(12) United States Patent
Van Bodegraven (10) Patent No.: US 10,136,500 B2
(45) Date of Patent: Nov. 20, 2018

(54) ISOLATED DRIVER

(71) Applicant: PHILIPS LIGHTING HOLDING B.V., Eindhoven (NL)

(72) Inventor: Tijmen Cornelis Van Bodegraven, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/562,630

(22) PCT Filed: Mar. 23, 2016

(86) PCT No.: PCT/EP2016/056318
§ 371 (c)(1),
(2) Date: Sep. 28, 2017

(87) PCT Pub. No.: WO2016/156130
PCT Pub. Date: Oct. 6, 2016

(65) Prior Publication Data
US 2018/0110107 A1  Apr. 19, 2018

(30) Foreign Application Priority Data

Mar. 30, 2015  (EP) .................................... 15161585

(51) Int. Cl.
*H05B 33/08* (2006.01)
*H05B 37/02* (2006.01)
(Continued)

(52) U.S. Cl.
CPC ....... *H05B 33/0887* (2013.01); *H04B 10/802* (2013.01); *H04L 27/10* (2013.01);
(Continued)

(58) Field of Classification Search
None
See application file for complete search history.

(56) References Cited

U.S. PATENT DOCUMENTS 6,088,244 A * 7/2000 Shioya .................... H02M 1/32
323/902
8,520,415 B1  8/2013 Ravishanker et al.
(Continued)

FOREIGN PATENT DOCUMENTS

EP  2284983 A1  2/2011
WO  9821813 A1  5/1998
(Continued)

*Primary Examiner* — Jany Richardson (57) ABSTRACT

The invention describes an isolated driver (2) comprising a converter module (21) realized to provide voltage and current output to a load (3); a feedback arrangement (22) realized to monitor voltage and/or current during operation of the driver (2); and a converter controller (1) for providing converter control signals (CI, CF, VCON) to the converter module (21), and wherein the converter controller (1) comprises a single optocoupler (10) connected by input terminals to the feedback arrangement (22); and a switching circuit arrangement (11) connected to output terminals of the optocoupler (10), comprising a number of semiconductor switches ($Q_{20}$, $Q_{25}$, $Q_{30}$, ..., $Q_{34}$) arranged to generate a converter control signal (CI, CF, VCON) for placing the converter module (21) of the driver (2) into a low-output mode ($M_{LO}$) when a voltage across the optocoupler output terminals indicates a fault condition. The invention further describes an LED lighting arrangement (5) comprising such an isolated driver (2) for driving an LED lighting load (3) from a mains power supply (4). The invention also describes a converter controller (1) for an isolated driver (2), and a method of operating an isolated driver (2).

13 Claims, 4 Drawing Sheets

(51) Int. Cl.
  *H04B 10/80*     (2013.01)
  *H04L 27/10*     (2006.01)
  *H02M 1/32*      (2007.01)
  *H02M 3/335*     (2006.01)
  *H03K 17/691*    (2006.01)

(52) U.S. Cl.
  CPC ....... *H05B 33/089* (2013.01); *H05B 33/0815*
       (2013.01); *H05B 33/0851* (2013.01); *H05B
       33/0884* (2013.01); *H05B 37/02* (2013.01);
              *H02M 1/32* (2013.01); *H02M 3/33523*
                 (2013.01); *H03K 17/691* (2013.01)

(56)           References Cited

U.S. PATENT DOCUMENTS

2013/0127358 A1* 5/2013 Yao .................... H05B 33/0815
                                                      315/201
2013/0127367 A1   5/2013 Esaki et al.
2014/0252954 A1   9/2014 Breuer et al.
2014/0328427 A1  11/2014 Chong et al.

FOREIGN PATENT DOCUMENTS

WO       2010035168 A1    4/2010
WO       2013014580 A1    1/2013
WO       2013067704 A1    5/2013

* cited by examiner

ISOLATED DRIVER

CROSS-REFERENCE TO PRIOR APPLICATIONS

This application is the U.S. National Phase application under 35 U.S.C. § 371 of International Application No. PCT/EP2016/056318, filed on Mar. 23, 2016 which claims the benefit of European Patent Application No. 15161585.3, filed on Mar. 30, 2015. These applications are hereby incorporated by reference herein.

FIELD OF THE INVENTION

The invention describes an isolated driver, a converter controller for an isolated driver, and a method of operating an isolated driver.

BACKGROUND OF THE INVENTION

A low-voltage device such as a lamp, a small household appliance etc. requires a power supply or "driver" for converting mains power into appropriate voltage and current for the device. For example, an LED light source can be driven from a power supply that converts the mains AC power into a DC output at a suitable level. Without protective measures being taken, a component failure somewhere in the circuit might result in an excessive voltage and/or current at some point, which can present a fire hazard or might put the user at risk from electric shock. Therefore, such drivers are generally constructed so that a primary side (connected to the mains) is isolated or separated from a secondary side (connected to the load). Such an isolated driver is also referred to as a mains-separated driver. To ensure safety, an isolated driver or power supply must ensure that the output voltage and current levels do not exceed a certain threshold. For example, the Underwriters Laboratories standard UL 1310 is directed at Class 2 power units for indoor and outdoor use. To obtain UL 1310 class 2 certification, a power supply or driver must ensure that its output voltage never exceeds 60 V, its output current never exceeds 2.5 A; and its output power never exceeds 100 W. These requirements must be fulfilled at all times during operation of the power supply or driver, even if a component of the overall circuit has failed. Therefore, manufacturers of such power supplies or drivers generally include some kind of protection circuit that isolates the secondary side of the driver from the primary side.

However, the prior art solutions are generally complex and require many components, thus adding to the design effort and the cost of the power supply product. In addition some fault situations may not be detected by and the driver cannot be considered fully compliant. As example of prior art, the man of the art can consult U.S. Pat. No. 8,520,415 or EP2284980 or US2014/0328427.

Therefore, it is an object of the invention to provide a more economical way of ensuring that the output of an isolated driver of the type described above remains within safety levels at all times during operation.

SUMMARY OF THE INVENTION

The object of the invention is achieved by the isolated driver of claim 1; by the converter controller of claim 11; and by the method of claim 13 of operating an isolated driver.

An isolated driver according to the invention comprises a converter module realized to provide voltage and current output to a load; a feedback arrangement realized to monitor voltage and/or current during operation of the driver; and a converter controller for providing converter control signals to the converter module, and wherein the converter controller comprises a single optocoupler connected by a pair of input terminals to the feedback arrangement, wherein an output transistor of the optocoupler is not conducting for indicating a fault condition; and a switching circuit arrangement connected to a pair of output terminals of the optocoupler, comprising a number of semiconductor switches arranged to generate a converter control signal for placing the converter module of the driver into a low-output mode when a voltage across the optocoupler output terminals indicates a fault condition.

An advantage of the isolated driver according to the invention is that the converter control signal keeps the converter operating in normal mode as long as the optocoupler output voltage is "healthy", but ensures that the converter module is placed into a low-output mode when there is a fault somewhere in the overall arrangement comprising driver and load. A "low-output mode" is to be understood as a mode of operation in which the output voltage and/or current are lower than their levels during a normal mode of operation. Since this safety measure can be realized using only a single optocoupler and a few semiconductor switches, an isolated driver according to the invention can be constructed very economically.

According to the invention, a converter controller for an isolated driver comprises a single optocoupler comprising input terminals for connecting to a feedback arrangement of the isolated driver, wherein an output transistor of the optocoupler is not conducting for indicating a fault condition; and a switching circuit arrangement connected to output terminals of the optocoupler, comprising a number of semiconductor switches arranged to generate a converter control signal for placing a converter module of the driver into a low-output mode when a voltage across the optocoupler output terminals indicates a fault condition.

An advantage of the converter controller according to the invention is that it can be implemented in a variety of driver types to ensure safe isolation between the primary and secondary sides, regardless of which component fails. The converter controller according to the invention can be realized in a more straightforward manner and using a smaller number of parts compared to a conventional isolation protection circuit. Since the converter controller according to the invention fulfills a protective function by ensuring that the converter module is placed into a safe low-output mode when there is a fault somewhere in the overall arrangement, the terms "converter controller" and "protection circuit" may be used interchangeably in the following.

According to the invention, the method of operating an isolated driver, which has a converter module to provide voltage and current output to a load, comprises the steps of providing afeedback signal from a feedback arrangement to monitor voltage and/or current during operation of the isolated driver; and transferring said feedback signal through an optocoupler to a switching arrangement controlling the converter module; providing a feedback signal that causes an output transistor of the optocoupler not to be conducting for indicating a fault condition; and placing the converter module of the driver into a low-output mode when a voltage across the optocoupler output terminals indicates a fault condition.

An advantage of the method according to the invention is that the converter controller or protection circuit ensures at all times that the voltage and/or current at the output of the driver never exceeds the permissible levels, and achieves this protection in a simple and cost-effective manner.

The dependent claims and the following description disclose particularly advantageous embodiments and features of the invention. Features of the embodiments may be combined as appropriate. Features described in the context of one claim category can apply equally to another claim category.

In the following, without restricting the invention in any way, it may be assumed that the converter module is a switched-mode power supply (SMPS) for providing voltage and current to the load. The converter module can be realized as a half-bridge converter, flyback converter, etc. Preferably, the isolated driver according to the invention is realized as a UL class 2 driver whose output voltage and current never exceed the limits mentioned above. The terms "isolated driver" and "mains-separated driver" may be used interchangeably in the following.

The purpose of the feedback arrangement of the isolated driver is to monitor voltage and/or current during operation. Preferably, the feedback arrangement is arranged in the secondary side of the isolated driver and the converter controller is arranged in the primary side of the driver. In this preferred arrangement, a control loop is established between the feedback arrangement, converter controller, and converter module, whereby the optocoupler effectively ensures galvanic isolation between the primary and secondary sides of the driver.

A fault condition can arise, as indicated above, by the failure of any component anywhere in the overall arrangement. A fault condition will result in an uncharacteristically high or low voltage at some point in the driver. The feedback arrangement can detect this and apply an appropriate voltage level at an optocoupler input terminal. For example, during normal operation, the feedback signal to one input terminal of the optocoupler can be "low", while the other terminal is permanently clamped "high", so that a current flows through the optocoupler diode, allowing the optocoupler transistor to conduct. During an electrical fault in the secondary side of the driver, in the converter module, or in the load, the fault condition will be detected by the feedback arrangement and converted to "high" voltage level at the optocoupler input terminal, so that the diode no longer conducts. In this way, the feedback arrangement forwards the "fault information" to the converter controller unit. This will respond to the fault condition by placing the converter into a low-output mode of operation. As a result, the secondary side continues to hold the feedback signal at its fault level, so that the fault condition is effectively "latched". This condition will persist until the driver is disconnected from the mains and restarted, even if the fault itself was of a transient nature. A permanent fault will prevent the driver from ever leaving the safe "low-output" mode of operation; however the driver can resume normal operation after re-starting if the fault was of a non-permanent nature, or if the cause of the fault was removed.

For various reasons, a voltage and/or current in an electrical circuit may sometimes briefly depart from its "correct" level, and then return to this correct level. Such a minor glitch may arise at any time, without necessarily being associated with a fault, for example as a result of electromagnetic interference (EMI). To avoid disabling the converter module, i.e. to avoid placing the converter module into a low-output mode of operation in the event of such a glitch, the switching circuit arrangement preferably comprises a delay circuit portion realized to delay the fault condition response by a predefined duration. In this way, only a true fault will trigger the fault response.

There are various ways of connecting an optocoupler between the primary side and secondary side of a driver. As indicated above, an optocoupler effectively comprises a diode connected between its input terminals, and an NPN bipolar junction transistor (BJT) connected between its output terminals so that the transistor is "on" as long as a current flows through the diode. In a preferred embodiment of the invention, the optocoupler is connected to the feedback arrangement such that a first output terminal of the optocoupler is at a low potential during normal operation and at a high potential during a fault condition. To this end, the optocoupler is connected to the feedback arrangement in such a way that "healthy" voltage and/or current levels at the secondary side result in a current flowing through the optocoupler diode, but "faulty" voltage and/or current levels at the secondary side prevent current flow through the optocoupler diode. This will result in an increase in voltage at the optocoupler output corresponding to the collector terminal of the NPN transistor. This increased voltage will switch a number of semiconductor transistors in order to latch a converter control signal, as will be explained in more detail with the aid of the diagrams.

Generally, the SMPS function of the converter module of an isolated driver is realized using an off-the-shelf integrated circuit. Therefore, in a preferred embodiment of the invention, the protection circuit is realized to generate a converter control signal according to a corresponding pin of the integrated circuit. For example, in a preferred embodiment of the invention, a converter control signal can be connected to a suitable regulation pin of such an IC, so that when a fault condition is detected, the converter control signal forces the SMPS into a low-output mode of operation. In a further preferred embodiment of the invention, if such an IC has an input pin for regulating the switching frequency of the SMPS, a converter control signal connected to that pin can increase the switching frequency in response to a fault. The increased switching frequency results in a lower output voltage and current at the load terminals.

As indicated above, a fault can also occur in the primary side of the driver. It is also possible that a fault occurs in the protection circuit, or that the optocoupler itself might fail. Therefore, in a preferred embodiment of the invention, a first converter control signal is generated in response to a first fault condition resulting in an increased voltage across the output terminals of the optocoupler, and a second converter regulation signal is generated in response to a second fault condition resulting in a decreased voltage across the output terminals of the optocoupler. In this way, any fault condition anywhere in the overall arrangement can be detected and responded to.

During startup or shutdown of the driver, voltage and/or current levels in the feedback arrangement or elsewhere in the driver may be different from their "normal" levels. Therefore, in a further preferred embodiment of the invention, fault detection and response is disabled during a startup and/or shutdown interval of the driver. This can be achieved, for example, by monitoring—in the protection circuit—one or more suitable output pins of a controller IC to determine whether the driver is in a startup or shutdown state.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
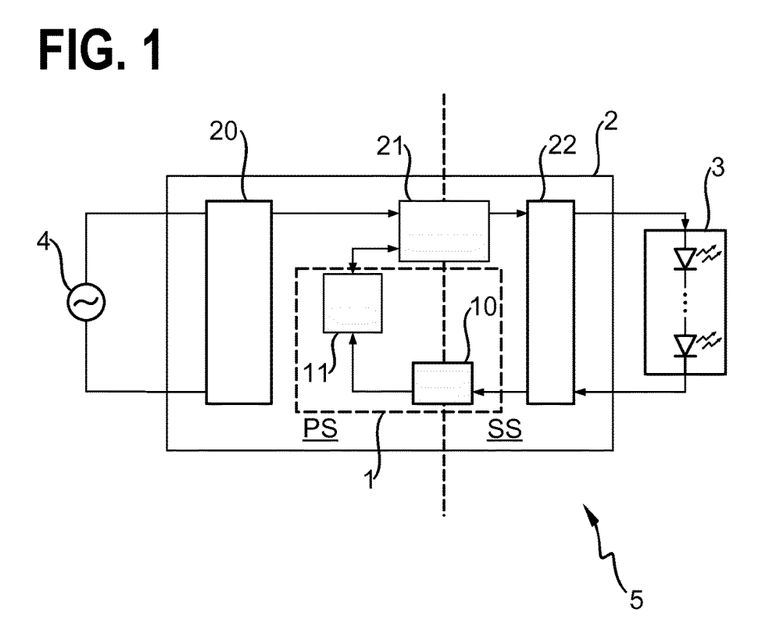
FIG. 1 shows a block diagram of an embodiment of an LED lighting arrangement according to the invention.

FIG. 1 shows a block diagram of an embodiment of an LED lighting arrangement 5 according to the invention, in which the isolated driver 2 according to the invention is connected between a mains supply 4 and a load 3. An input stage 20 performs AC/DC conversion, and a power converter 21—for example an SMPS converter 21—converts the DC power into a form suitable for driving the LED load 3. A feedback arrangement 22 of the driver 2 is connected between the converter 21 and the load 3, to monitor voltage and current levels during operation. Although not shown in the diagram, a microcontroller on the primary side PS and a microcontroller on the secondary side SS can be implemented to fulfill various control operations. The driver 2 is divided into a primary side PS (connected to the mains 4) and a secondary side SS (connected to the load 3), and these must be separated or isolated from each other (as indicated by the broken line) in order to satisfy certain safety criteria as explained in the introduction. In this embodiment, protection is achieved by a converter controller 1, which places the SMPS converter 21 into a low-output mode of operation in the event of a fault anywhere in the overall arrangement 5. In a low-output mode of operation, the voltage and current at the output of the driver 2 do not exceed the limits mentioned in the introduction. This is achieved by control signals applied by the switching circuit arrangement 11 to the converter module 21, as will be explained with the aid of FIGS. 2 and 3. The diagram indicates a control loop through the feedback arrangement 22, optocoupler 10, switching circuit arrangement 11, and converter module 21.

Figure 2:
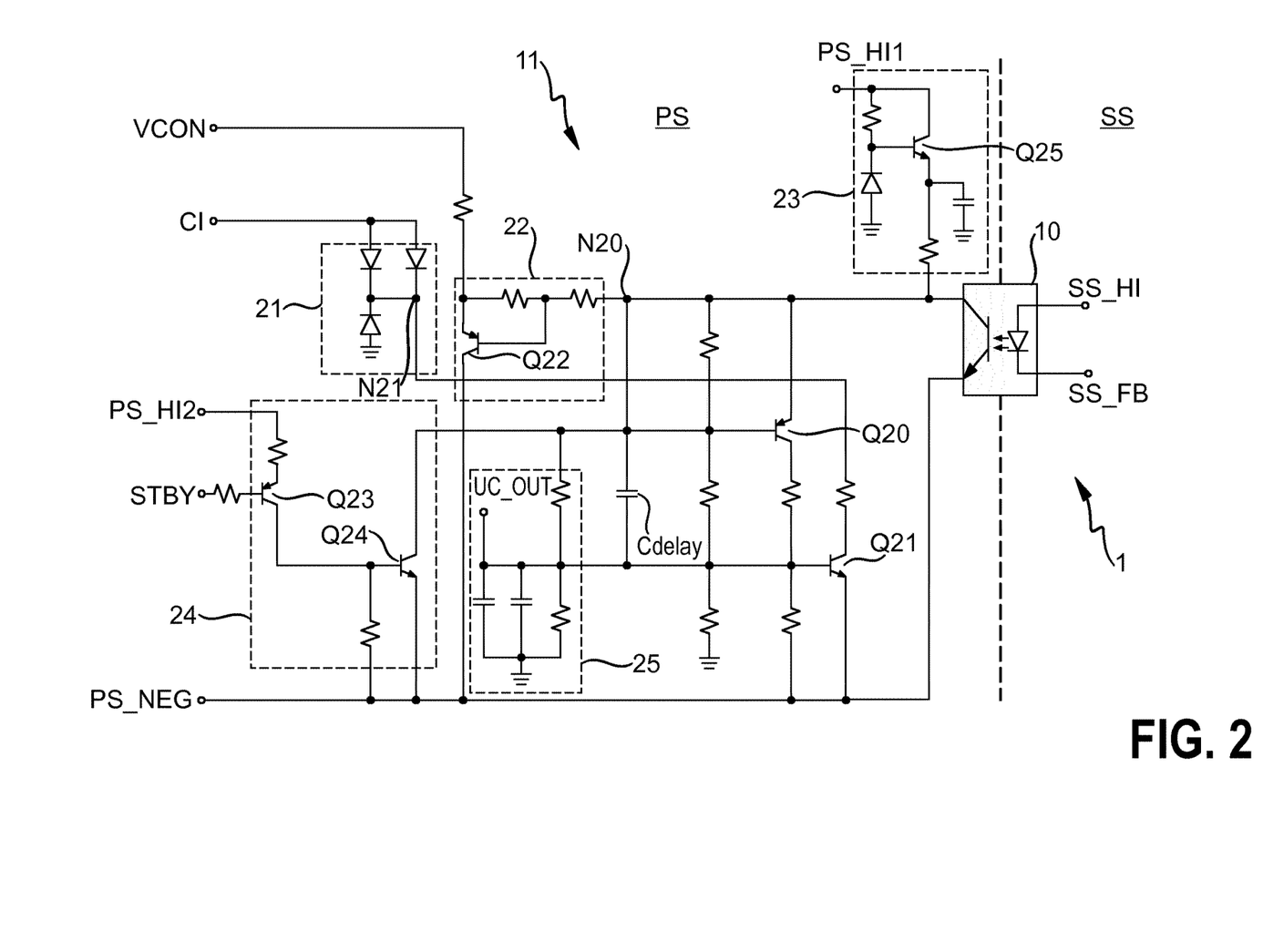
FIG. 2 shows a first embodiment of the protection circuit according to the invention.

FIG. 2 shows a first embodiment of the protection circuit 1 according to the invention. The diagram shows a single optocoupler 10 between the primary side PS and the secondary side SS of the driver. A first input terminal of the optocoupler is connected to a high potential SS_HI on the secondary side, and the other input terminal SS_FB is connected to the feedback arrangement 22 of FIG. 1, so that as long as the voltage and current levels at the secondary side of the driver are alright, a current will flow between the input terminals of the optocoupler 10. The switching circuit arrangement 11 is connected across the output terminals of the optocoupler 10. In this embodiment, signals CI, VCON, STBY originate from an SMPS IC package 21. Signal CI is a regulation pin of the SMPS IC, which, when pulled low, will place the SMPS converter in low-output mode of operation; signal VCON is a further regulation pin of the SMPS IC; and signal STBY indicates when the driver is in startup/shutdown mode. Certain nodes are held at suitable high levels by terminals PS_HI1, PS_HI2, or at suitable low potentials by a connection to ground GND or to a negative potential PS_NEG.

Healthy operation of the driver is characterized by a low voltage at node N20, since the NPN transistor of the optocoupler 10 will conduct during normal operation as long as the feedback signal SS_FB is held at a "healthy" low voltage. During a fault in the secondary side, the load, or in the converter module, a high voltage is applied to this terminal SS_FB so that a lower current or no current will flow through the optocoupler diode, resulting in a voltage increase at node N20. This results in PNP transistor Q20 being turned on, so that NPN transistor Q21 is also turned on, which in turn pulls the CI pin of the SMPS IC to a low level through node N21. A delay element $C_{delay}$ in circuit portion 20 ensures that a transient voltage increase at node N20 does not trigger a fault response.

In this exemplary embodiment, the input signal STBY is active low, and indicates when the driver is in startup/shutdown mode (low) or normal mode of operation (high). Therefore, during driver startup or shutdown, transistor Q23 of a standby circuit portion 24 conducts, ensuring that transistor Q24 conducts, which in turn pulls node N20 low. This effectively disables the protection circuit 11.

Once a fault condition has occurred, whether it is transient or permanent, it is "latched" as described above as a result of placing the converter into a "low output" mode of operation, which in turn causes the feedback arrangement to maintain the high voltage at the optocoupler input terminal SS_FB.

In the event of a failure in the CI pin circuit path, transistor Q21 will conduct, thus pulling N20 to a low potential, with the result that transistor Q22 conducts. This has the effect of pulling the VCON low, thereby placing the SMPS IC in a low-output mode of operation. If the optocoupler 10 should fail, circuit portion 23 ensures that the voltage at node N20 increases, resulting in pin CI being pulled low as explained above. The output signal UC_OUT to the microcontroller is low in the absence of a fault during normal operation and high when a fault condition has been detected and "latched".

Circuit portions 21, 23, 25 share a ground terminal of the converter IC, while circuit portion 24 is grounded with the rest of the driver circuitry. The skilled person will be familiar with the circuit elements shown here, and will be able to choose appropriate components and their values in order to achieve the desired operation.

Figure 3:
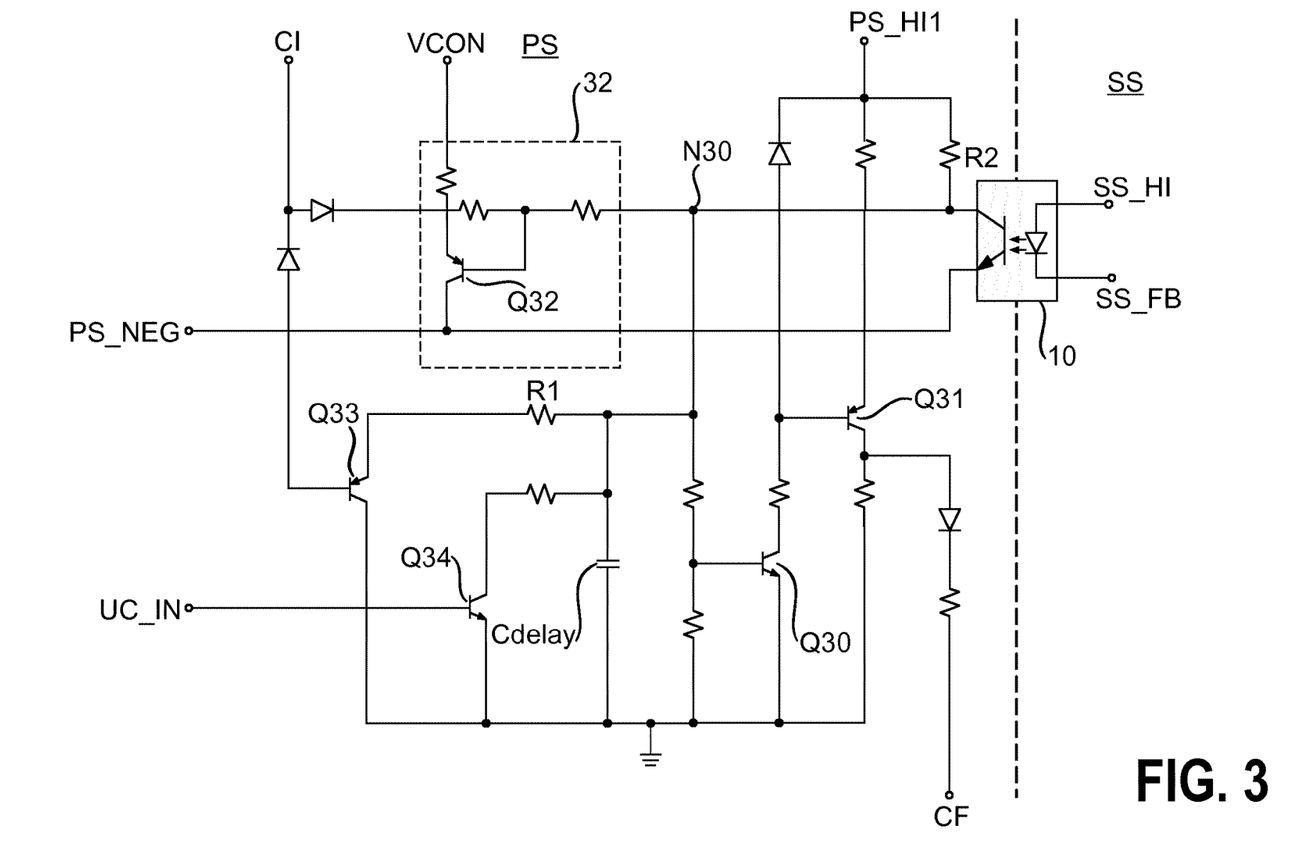
FIG. 3 shows a second embodiment of the protection circuit according to the invention.

FIG. 3 shows a second embodiment of the protection circuit 1 according to the invention. Here, in a manner similar to the circuit of FIG. 2, a high voltage at node N30 during a fault will result in transistors Q30, Q31 being turned on, so that the voltage at output signal CF increases. In this exemplary embodiment, output CF is connected to a frequency regulation input pin of the SMPS IC. The voltage level of this pin determines the switching frequency of the SMPS IC. By increasing the voltage at output CF during a fault, the switching frequency of the SMPS is increased, thereby lowering the output voltage and current, so that the driver complies with the safety requirements mentioned in the introduction. Here also, a delay element $C_{delay}$ ensures that a transient voltage increase at node N30 does not trigger a fault response.

During steady-state or normal operation, the voltage at node N30 should keep the voltage on the CI pin below its clamp voltage, e.g. 3.2 V as specified by the SMPS IC. This determines the maximum "normal mode" voltage at node N30, and the fault condition "trigger level" must be above this level. When the CI pin current is zero, i.e. during steady state operation, the voltage $U_{N30}$ at node N30 is given by:

$$U_{N30} = U_{CI\_clamp} - V_d \quad (1)$$

where $U_{CI\_clamp}$ is the clamp voltage of the CI pin as specified by the SMPS IC, and $V_d$ is the voltage drop across the diode.

When the optocoupler transistor is not conducting on account of a fault, the voltage at node N30 will be limited by the clamp voltage of the CI pin. This voltage can be expressed as:

$$U_{N30} = PS\_HI1 \cdot R1 + (U_{CI\_clamp} + V_d + V_{be}) \cdot R2/R1 + R2 \quad (2)$$

where R1, R2 are values of resistance, PS_HI1 is a high voltage supplied by the primary side, and $V_{be}$ is the voltage drop across transistor Q30.

When the voltage at node N30 reaches a certain high level, transistor Q30 will start to conduct. This will activate transistor Q31 in turn, resulting in a defined current being injected into the CF pin of the SMPS IC, thereby increasing the switching frequency. At this higher switching frequency, the output voltage, current and power will stay below the limits of a UL class 2 driver. The "trigger level" of the protection circuit should lie between the voltages given in equations (1) and (2), and the trigger sensitivity can be tuned by capacitor $C_{delay}$, which defines a trigger delay in combination with resistor R2.

During a startup phase, the CI pin has a low voltage, for example 0.38 V. This voltage will clamp the voltage at node N30 via Q33, to prevent protection during startup. In this embodiment a signal UC_IN, originating from the driver microcontroller, is low during steady-state operation of the SMPS converter. At other times, this signal is high, so that transistor Q34 conducts to pull node N30 to a low potential, ensuring that transistors Q30, Q31 remain "off" so that the CI pin is not pulled low during startup or shutdown of the driver. For example, during shutdown, the bus voltage will decrease. When it drops below a certain threshold, transistor Q34 is turned on by the primary side microcontroller by means of the high signal UC_IN, keeping the voltage at node N30 at a low level and preventing protection during switch-off. In the absence of a primary side microcontroller, transistor Q34 can be controlled using an additional switch, as will be known to the skilled person.

In the event of a failure in the CI pin circuit path, transistor Q35 will conduct, so that the voltage at node N30 will decrease, resulting in pin VCON being pulled low by the transistor Q32 of circuit portion 32, with the result that the SMPS IC is placed in a low-output mode of operation. If the optocoupler should fail, the voltage at node N30 increases on account of the input PS_HI1, resulting in pin CI being pulled low by the action of transistors Q30, Q31 as explained above.

Figure 4:
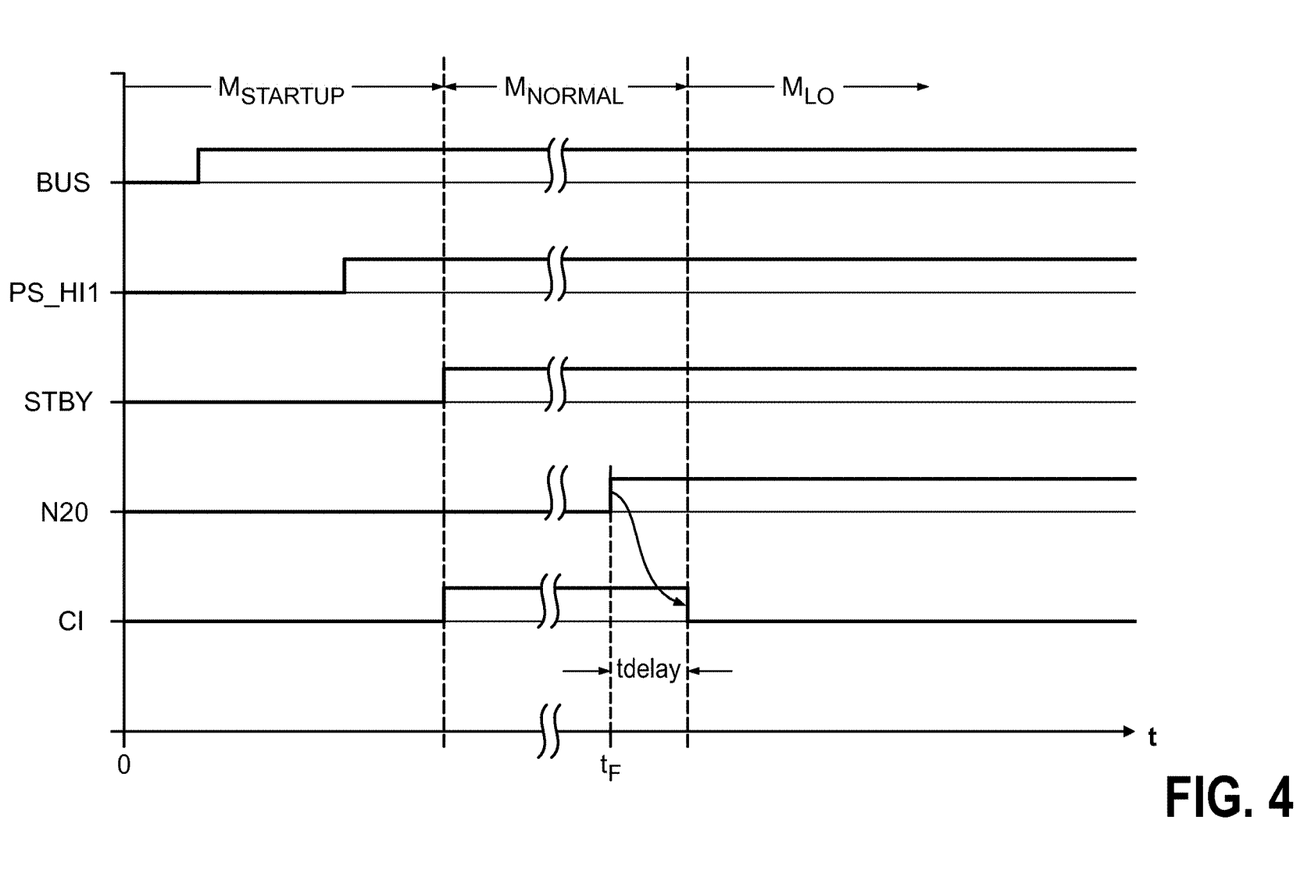
FIG. 4 shows an exemplary timing diagram of the LED lighting arrangement of FIG. 1.

FIG. 4 shows an exemplary and very simplified timing diagram of the LED lighting arrangement of FIG. 1 using the protection circuit of FIG. 2. Only the relevant signals are shown. For the sake of clarity, actual signal values are not shown; only the minimum and maximum levels of each signal are indicated instead. During startup mode $M_{STARTUP}$, the driver is been connected to a mains supply, and a bus voltage is applied to the SMPS converter. The microcontroller on the primary side starts to operate, providing the voltage level PS_HI1. Once the secondary side microcontroller is also active, the signal STBY indicates that the driver is now in a normal mode of operation $M_{NORMAL}$. The regulation input CI to the SMPS IC is high, so that the rated output voltage and current are provided to the load. This mode of operation $M_{NORMAL}$ can persist for any duration. If a fault occurs, as indicated at time $t_F$, the voltage at node N20 rises to its "fault level". This can happen when the optocoupler input terminal SS_FB is pulled high, for example. After a delay $t_{delay}$ (determined by the capacitor $C_{delay}$) to avoid false triggering, the CI pin is pulled low. This places the driver into a low-output mode $M_{LO}$, as described above, during which the voltage and current at the output of the driver are below the threshold levels as required for a UL class 2driver. This state $M_{LO}$ will persist until the driver is disconnected from the mains as described above. Although the diagram does not show this, if normal operation is brought to a close in the usual manner by turning off the load, the driver enters a shutdown mode during which the signal STBY is brought low to disable the fault protection circuit, thus allowing the system to shut down in the usual controlled manner.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. An isolated driver comprising a converter module realized to provide voltage and current output to a load; a feedback arrangement realized to monitor voltage and/or current during operation of the driver; and a converter controller for providing converter control signals (CI, CF, VCON) to the converter module, and characterized in that the converter controller comprises
    a single optocoupler connected by input terminals to the feedback arrangement, wherein the optocoupler is not conducting for indicating a fault condition; and
    a switching circuit arrangement connected to output terminals of the optocoupler, comprising a number of semiconductor switches ($Q_{20}, \ldots, Q_{25}, Q_{30}, \ldots, Q_{34}$) arranged to generate a converter control signal (CI, CF, VCON) for placing the converter module of the driver into a low-output mode ($M_{LO}$) when a voltage across the optocoupler output terminals indicates a fault condition.

2. An isolated driver according to claim 1, wherein the feedback arrangement is arranged in the secondary side (SS) of the isolated driver and the converter controller is arranged in the primary side (PS) of the isolated driver.

3. An isolated driver according to claim 1, wherein the switching circuit arrangement is realized to latch a converter control signal (CI, CF, VCON) in response to a fault condition.

4. An isolated driver according to claim 1, wherein the switching circuit arrangement comprises a delay element ($C_{delay}$) realized to delay the fault condition response by a predefined duration ($t_{delay}$).

5. An isolated driver according to claim 1, wherein the optocoupler is connected to the feedback arrangement such that a first output terminal of the optocoupler is at a low potential during normal operation and at a high potential during a fault condition.

6. An isolated driver according to claim 1, wherein the converter module comprises an integrated circuit, and the switching circuit arrangement is realized to generate a converter control signal (CI, CF, VCON) for connecting to a corresponding pin of the integrated circuit.

7. An isolated driver according to claim 1, wherein a first converter control signal (CI, CF) is generated in response to a first fault condition resulting in an increased voltage across the output terminals of the optocoupler, and a second converter control signal (VCON) is generated in response to a second fault condition resulting in a decreased voltage across the output terminals of the optocoupler.

8. An isolated driver according to claim 1, realized as a UL class 2 driver.

9. An LED lighting arrangement comprising an isolated driver according to claim 1 for driving an LED lighting load from a mains power supply.

10. An isolated driver comprising a converter module realized to provide voltage and current output to a load; a feedback arrangement realized to monitor voltage and/or current during operation of the driver; and a converter controller for providing converter control signals (CI, CF, VCON) to the converter module, and characterized in that the converter controller comprises
   a single optocoupler connected by input terminals to the feedback arrangement, wherein the optocoupler is not conducting for indicating a fault condition; and
   a switching circuit arrangement connected to output terminals of the optocoupler, comprising a number of semiconductor switches ($Q_{20}, \ldots, Q_{25}, Q_{30}, \ldots, Q_{34}$) arranged to generate a converter control signal (CI, CF, VCON) for placing the converter module of the driver into a low-output mode ($M_{LO}$) when a voltage across the optocoupler output terminals indicates a fault condition,
   wherein a converter control signal (CF) increases the switching frequency of the converter module in response to a fault condition.

11. A converter controller for an isolated driver, comprising
   a single optocoupler comprising input terminals for connecting to a feedback arrangement of the isolated driver, wherein the optocoupler is not conducting for indicating a fault condition; and
   a switching circuit arrangement connected to output terminals of the optocoupler, comprising a number of semiconductor switches ($Q_{20}, \ldots, Q_{25}, Q_{30}, \ldots, Q_{34}$) arranged to generate a converter control signal (CI, CF, VCON) for placing a converter module of the driver into a low-output mode ($M_{LO}$) when a voltage across the optocoupler output terminals indicates a fault condition.

12. A method of operating an isolated driver comprising a converter module to provide voltage and current output to a load, which method comprises the steps of
   providing a feedback signal (SS_FB) from a feedback arrangement to monitor voltage and/or current during operation of the isolated driver; and
   transferring said feedback signal through an optocoupler to a switching arrangement controlling the converter module;
characterized in that it further comprises the steps of:
   providing a feedback signal (SS_FB) that causes the optocoupler not to be conducting for indicating a fault condition; and
   placing the converter module of the driver into a low-output mode ($M_{LO}$) when a voltage across the optocoupler output terminals indicates a fault condition.

13. A method according to claim 12, comprising the step of disabling the switching circuit arrangement during a startup and/or shutdown interval of the isolated driver.

* * * * *